(12) United States Patent
Oh et al.

(10) Patent No.: US 8,944,874 B2
(45) Date of Patent: Feb. 3, 2015

(54) ORGANIC LIGHT EMITTING DISPLAY AND METHOD FOR FABRICATING THE SAME

(71) Applicant: LG Display Co., Ltd., Seoul (KR)

(72) Inventors: Il-Su Oh, Seoul (KR); Jong-Sung Kim, Seoul (KR); Hong-Woo Yu, Gyeongsangbuk-Do (KR); Kwang-Yeon Lee, Gyeongsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 6 days.

(21) Appl. No.: 14/174,341

(22) Filed: Feb. 6, 2014

(65) Prior Publication Data
US 2014/0154829 A1 Jun. 5, 2014

Related U.S. Application Data

(62) Division of application No. 11/819,937, filed on Jun. 29, 2007, now Pat. No. 8,686,629.

(30) Foreign Application Priority Data

Jun. 30, 2006 (KR) .................. 10-2006-0061612

(51) Int. Cl.
*H01J 1/62* (2006.01)
*H01L 51/52* (2006.01)
*H01L 27/32* (2006.01)

(52) U.S. Cl.
CPC ........ *H01L 51/5281* (2013.01); *H01L 27/3246* (2013.01); *H01L 27/3283* (2013.01)
USPC ........................................... 445/24; 313/504

(58) Field of Classification Search
CPC .................. H01L 27/3246; H01L 27/3283

USPC ............................................................ 445/24
See application file for complete search history.

(56) References Cited

U.S. PATENT DOCUMENTS 6,440,860 B1 8/2002 DeBoer et al.
2002/0008467 A1* 1/2002 Nagayama et al. ........... 313/506
(Continued)

FOREIGN PATENT DOCUMENTS

JP 2001-284041 10/2001
JP 2003-045669 2/2003
KR 10-2001-0109639 12/2001

OTHER PUBLICATIONS

Machine Translation of JP 60-253193 and JP 2-195685 (Non-Final Office Action dated Jul. 20, 2009 in U.S. Appl. No. 11/819,937.).

*Primary Examiner* — Nimeshkumar Patel
*Assistant Examiner* — Jacob R Stern
(74) *Attorney, Agent, or Firm* — McKenna Long & Aldridge LLP

(57) ABSTRACT

An organic light emitting display device (OLED) includes a transparent substrate a first electrode formed on the transparent substrate a partition wall including first and second tapered structures having different tapers and formed on the first electrode, and an organic light emitting layer stacked on both sides of the first electrode below a level of the partition wall and a second electrode. The OLED device is manufactured by, for example, forming a first electrode on a transparent substrate, forming a partition wall having first and second tapered structures on the first electrode, and forming an organic light emitting layer and a second electrode, sequentially, on both sides of the first electrode below a level of the partition wall.

3 Claims, 6 Drawing Sheets

(56) References Cited

U.S. PATENT DOCUMENTS

| | | | |
|---|---|---|---|
| 2002/0090579 A1* | 7/2002 | Chung et al. | 430/321 |
| 2005/0052120 A1 | 3/2005 | Gupta et al. | |
| 2005/0285512 A1 | 12/2005 | Murayama | |
| 2007/0188093 A1* | 8/2007 | Nagara et al. | 313/512 |

* cited by examiner

US 8,944,874 B2

ORGANIC LIGHT EMITTING DISPLAY AND METHOD FOR FABRICATING THE SAME

This application is a divisional of prior application Ser. No. 11/819,937, filed Jun. 29, 2007, now allowed, and claims the benefit of Korean Patent Application No. 10-2006-061612, filed in Korea on Jun. 30, 2006, which are hereby incorporated by reference for all purposes as if fully set forth herein.

BACKGROUND OF THE INVENTION

The present invention relates to an organic light emitting display device (OLED) and to a method for fabricating the same, and particularly, to an organic light emitting display device provided with a partition wall structure which is capable of preventing a fade-out phenomenon when devices are driven and enhancing the image quality and to a method for fabricating the same.

Generally, an organic light emitting layer is formed between two poles in an OLED, so that when charges are injected into a positive pole, electrons and holes are coupled to form excitons for generating light having a specific wave length therefrom.

A typical OLED will be described with reference to FIG. 1 which is a cross-sectional view schematically showing a structure of a typical OLED.

Referring to FIG. 1, the OLED includes an anode electrode 13 which is a transparent electrode on a glass substrate 11 and is used as a positive pole, a hole injecting layer 15, a light emitting layer 17 and an electron injecting layer 19 that are sequentially stacked, and a cathode electrode 21 used as a negative pole on the electron injecting layer 19.

With such a typical OLED, when a driving voltage is supplied to the anode electrode 13 and the cathode electrode 21, holes in the hole injecting layer 15 and electrons in the electron injecting layer 19 respectively move towards the light emitting layer 17, thereby exciting a fluorescent material in the light emitting layer 17.

The typical OLED has advantages such as being capable of driving at a low voltage, a high light emitting efficiency, a broad viewing angle, a rapid response speed and the like.

The organic materials used in the OLED are divided into a monomeric (so-called "mono-molecule") type and a high molecular weight (so-called "high molecule") type according to the kind of the organic material used.

The OLEDs can be divided into a monomolecular type OLED using a mono-molecule organic material, a high molecular type OLED using a high molecule organic material, and a mixed type OLED using both the high molecule material and the mono-molecule material according to the particular organic materials used.

In this aspect, an OLED in accordance with the related art will be described with reference to FIG. 2.

FIG. 2 is a cross-sectional view of an OLED in accordance with the related art.

Referring to FIG. 2, the OLED in accordance with the related art includes a first electrode 53 as an anode electrode on a glass substrate 51 and a partition wall 55a having an inversely-tapered shape on the first electrode 53.

Further, an organic light emitting layer 65 and a second electrode 67 as a cathode electrode are stacked on both sides of the first electrode 53 below the inversely-tapered partition wall 55a.

A method for fabricating the typical OLED having such a structure will be described with reference to FIGS. 3A-3D.

FIGS. 3A-3D are cross-sectional views showing a fabrication process of an OLED in accordance with the related art.

Referring to 3A, a transparent electrode layer 53 formed of a transparent electrode material such as ITO is formed on the glass substrate 51 by sputtering. The transparent electrode layer 53 serves as a first electrode for a cathode electrode.

After an organic insulating film 55 such as a silicon nitride film (SiNx) is stacked on the transparent electrode layer 53, a positive photoresist 57 is coated on the organic insulating film 55, and then a pre-bake process is performed.

Ultraviolet light 61 is irradiated to the positive photoresist 57 for exposing the positive photoresist 57 to light through a photolithography process using an exposure mask 59 for forming a partition wall, and then the exposed positive photoresist 57 is developed to form a photoresist pattern 57a as shown in FIG. 3B.

Referring to FIG. 3B, an etching process is performed using an etchant with the photoresist pattern 57a serving as a mask to selectively remove the organic insulating film 55, and thereby, the partition wall 55a is formed on the transparent electrode layer 53 as shown in FIG. 3C.

Finally, after removing the photoresist pattern 57a remaining on the partition wall 55a, an organic light emitting layer 65 and a second electrode 67 made of a conductive material such as Al so as to serve as the cathode electrode are formed on the transparent electrode layer 53 and the partition wall 55a.

Here, though not shown in the drawings, a hole injecting layer and an electron injecting layer are stacked underneath and on the organic light emitting layer 65, respectively.

However, the OLED and the method for fabricating the same in accordance with the related art have a drawback.

Though it is not shown in the drawings, in the fabrication process of the typical OLED, an organic material is deposited by a thermal deposition method using a shadow mask, because a photolithography process is not usable for forming the organic material pattern.

However, when the shadow mask is used for the deposition, a shadow phenomenon may occur when forming an organic layer mount.

Thus, when the device is driven, an organic layer shadow phenomenon occurs at an edge portion of pixel, so that the brightness of the device may be degraded, and moreover, a fade-out, a phenomenon wherein image becomes blurred at the time of image driving, as shown at "A" in FIG. 2, may occur.

SUMMARY OF THE INVENTION

Accordingly, the present invention is directed to an organic light emitting display device (OLED) and method for fabricating the same that substantially obviates one or more of the problems due to limitations and disadvantages of the related art.

An advantage of the present invention is to provide an organic light emitting display device (OLED) which is capable of preventing a fade-out phenomenon from occurring when OLED display devices are driven and enhancing the image quality and a method for fabricating the same.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an OLED includes a transparent substrate;

a first electrode on the transparent substrate; a partition wall on the first electrode, the partition including first and second tapered structures; and an organic light emitting layer stacked on both sides of the first electrode below a level of the partition wall and a second electrode.

In another aspect, a method for fabricating the OLED includes providing a transparent substrate; forming a first electrode on the transparent substrate; forming a partition wall including first and second tapered structures on the first electrode; and forming an organic light emitting layer and a second electrode, sequentially, on both sides of the first electrode below a level of the partition wall.

In another aspect, an OLED a transparent substrate; a first electrode on the transparent substrate; a partition wall on the first electrode, the partition wall having a double-layered structure with two insulating material films, the two insulating material films having different composition ratios; and an organic light emitting layer and a second electrode, which are formed on both sides of the first electrode below a level of the partition wall.

In yet another aspect, a method for fabricating an OLED includes providing a transparent substrate; forming a first electrode on the transparent substrate; forming a partition wall on the first electrode, the partition wall having a double-layered structure with two insulating material films, the two insulating material films having different composition ratios; and stacking an organic light emitting layer and a second electrode on both sides of the first electrode below a level of the partition wall.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, example of which is illustrated in the accompanying drawings.

Figure 1:
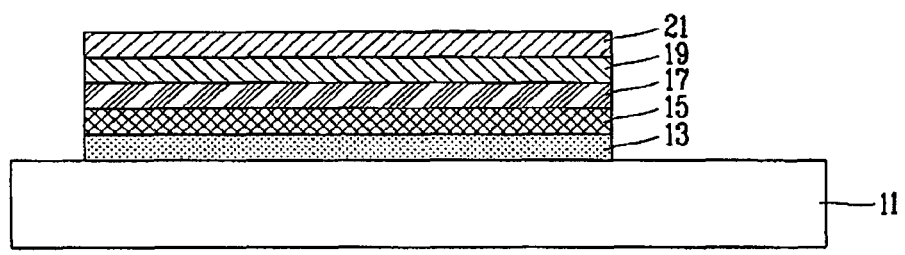
FIG. 1 is a cross-sectional view of a typical organic light emitting display device (OLED).
Figure 2:
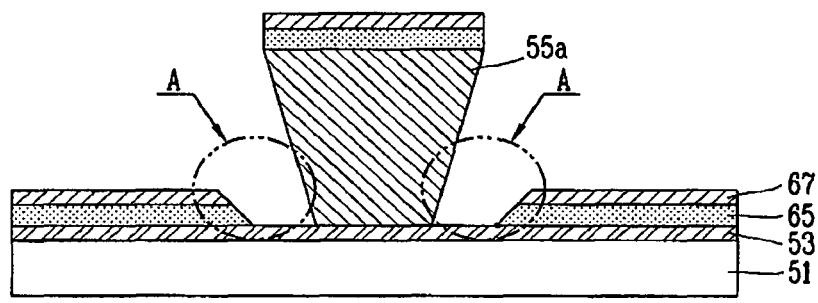
FIG. 2 is a cross-sectional view of an OLED in accordance with the related art.
Figure 3A:
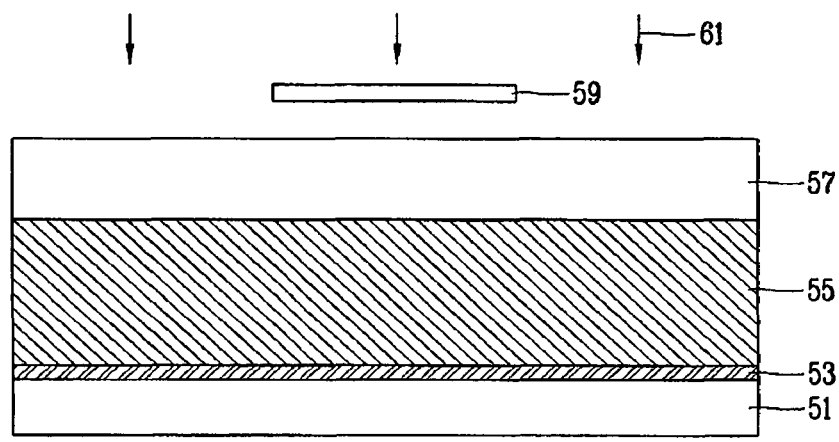
FIGS. 3A through 3D are cross-sectional views respectively showing a fabrication process of the OLED in accordance with the related art.
Figure 3B:
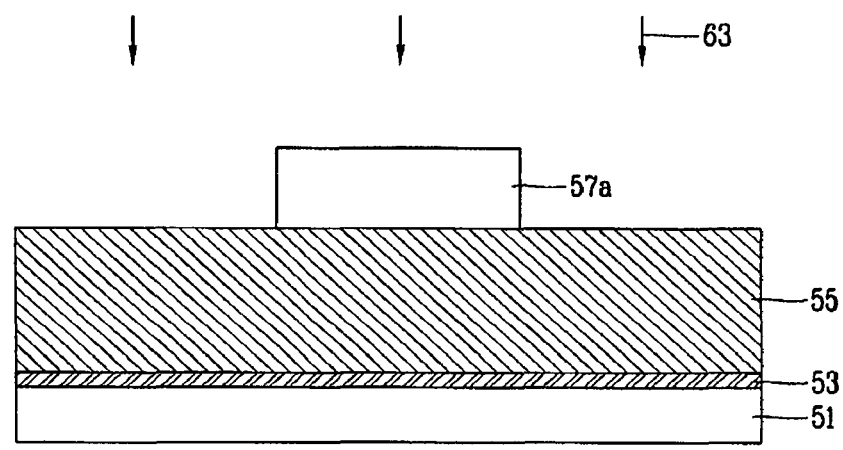
Figure 3C:
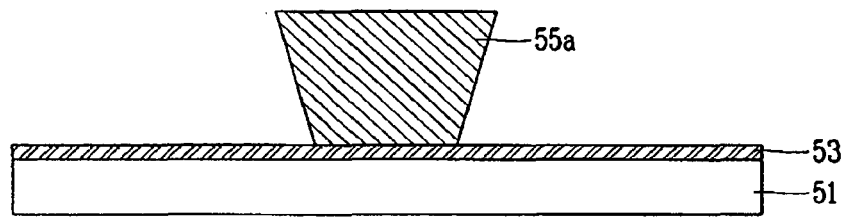
Figure 3D:
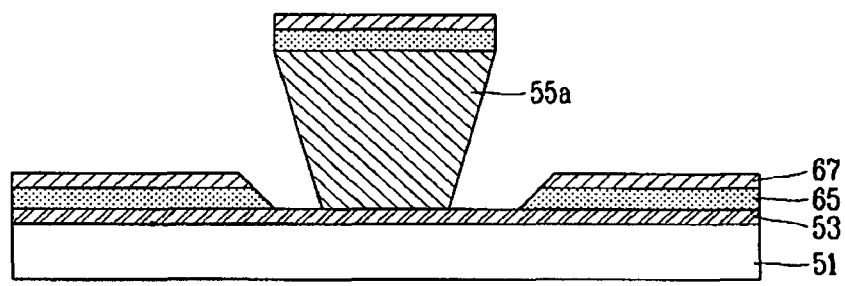
Figure 4:
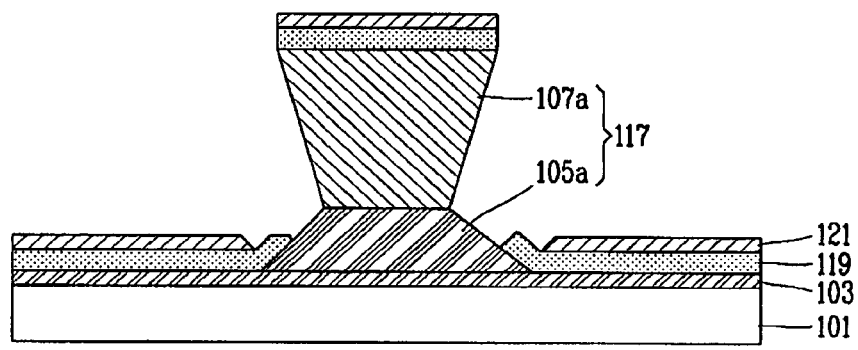
FIG. 4 is a cross-sectional view illustrating an OLED in accordance with the present invention.

FIG. 4 is a cross-sectional view illustrating an OLED in accordance with the present invention.

Referring to FIG. 4, the OLED includes a first electrode 103 formed on an insulating transparent substrate 101, a partition wall 117 having a first tapered structure 105a and a second tapered structure 107a formed on the first electrode 103, and an organic light emitting layer 119 and a second electrode 121, which are stacked on both sides of the first electrode 103 below the partition wall 117.

The first tapered structure 105a may be a forwardly-tapered (i.e., inwardly-tapering) shape and the second tapered structure 107a may be an inversely-tapered (i.e., outwardly-tapering) shape, both of which constitute the partition wall 117. Further, the second tapered structure 107a may be thicker than the first tapered structure 105a.

Although not shown in the drawings, a hole injecting layer and an electron injecting layer may be formed underneath and on the organic light emitting layer 119, respectively.

Next, a method for fabricating the OLED in accordance with the present invention will be described with reference to FIGS. 5A through 5D.

FIGS. 5A through 5D are cross-sectional views illustrating a fabrication process of the OLED in accordance with the present invention.

Figure 5A:
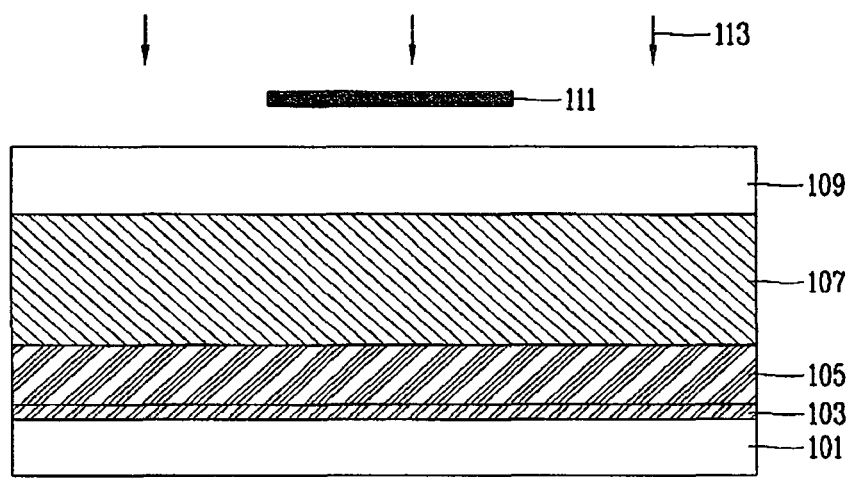
FIGS. 5A through 5D are cross-sectional views illustrating a fabrication process of the OLED in accordance with the present invention.

Referring to FIG. 5A, the transparent electrode layer 103 including a transparent electrode material such as ITO is first formed on the transparent substrate 101 by a sputtering deposition method.

The transparent electrode layer 103 may serve as a first electrode for a cathode electrode. A first silicon nitride film (SiNx) 105 and a second silicon nitride film (SiNx) 107 are sequentially stacked on the transparent electrode layer 103. When the first silicon nitride film 105 and the second silicon nitride film 107 are deposited, the composition ratio of silicon (Si) and Nitrogen (Nx) may be different therebetween.

Additionally, besides the silicon nitride film, a silicon oxide film, or an inorganic material or an acryl-based organic material can be used for forming the first silicon nitride film 105 and the second silicon nitride film 107.

A positive photoresist 109 is coated on the second silicon nitride film 107, and then a pre-bake process is performed. A negative photoresist can be used instead of the positive photoresist 109.

Figure 5B:
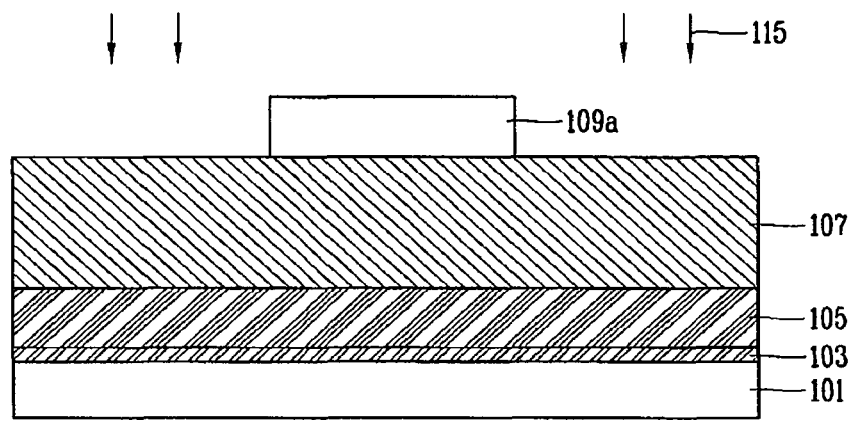

Ultraviolet light 113 is irradiated onto the positive photoresist 109 for exposing the positive photoresist 109 to light through a photolithography process using an exposure mask 111 for forming a partition wall, and then the exposed positive photoresist 109 is developed to form a photoresist pattern 109a as shown in FIG. 5B.

Figure 5C:
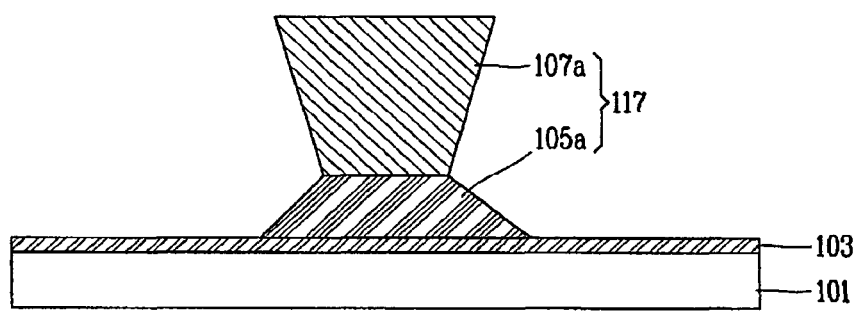
Figure 5D:
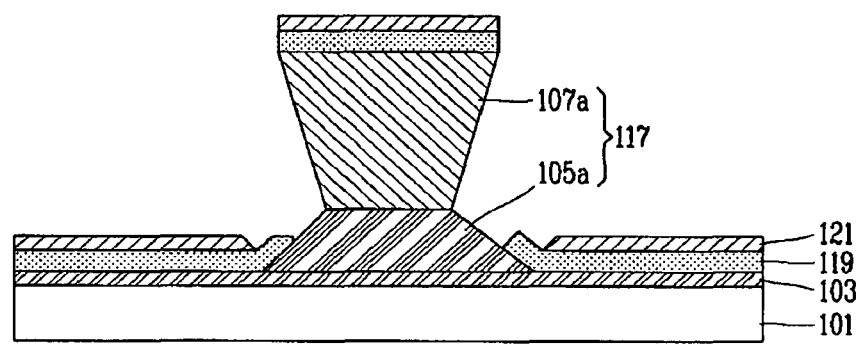

Referring to FIG. 5B, a dry etching process 115 is performed with the photoresist pattern 109a serving as a mask, to selectively remove the second silicon nitride film 107 and the first silicon nitride 105, which have different composition ratios between the silicon (Si) and nitrogen (Nx) therein, and thereby, the partition wall 117 including a first silicon nitride film pattern 105a and a second silicon nitride film pattern 107a are formed on the transparent electrode layer 103 as shown in FIG. 5C.

The second silicon nitride film pattern 107a constituting an upper portion of the partition wall 117 may be an inversely-tapered shape and the first silicon nitride film pattern 105a constituting a lower portion a forwardly-tapered shape. This is because the first silicon nitride film 105 and the second silicon nitride film 107 have different profiles at the time of the dry etching process due to the different composition ratios between silicon (Si) and nitrogen (Nx).

Further, the second silicon nitride film pattern 107a constituting the partition wall 117 may be the inversely-tapered shape so as to separate a second electrode which is to be formed in a succeeding process, and the first silicon nitride film pattern 105a constituting the partition wall 117 may be the forwardly-tapered shape to form the organic material adjacent to the partition wall 117 in a uniform thickness.

The etching of the first silicon nitride 105 and the second silicon nitride 107 may be processed from an interface between the first silicon nitride film 105 and the second silicon nitride film 107 to have the forwardly-tapered shape and the inversely-tapered shape, respectively, as shown in FIG. 5C.

Finally, with reference to FIG. 5C, after removing the photoresist pattern 109a remaining on the second silicon nitride film pattern 107a constituting the partition wall 117, the organic light emitting layer 119 and the second electrode 121 composed of a conductive material such as Al so as to serve as the cathode electrode are sequentially stacked on the transparent electrode layer 103 and the second silicon nitride film pattern 107a constituting the partition wall 117, respectively.

Although not shown in the drawings, a hole injecting layer and an electron injecting layer may be stacked underneath and on the organic light emitting layer 119, respectively.

According to the present invention, silicon nitride films having different composition ratios between their silicon and nitrogen contents are formed and dry-etched to form a partition wall having a double-tapered structure having different shapes from each other by using difference in the dry etching rates thereof, thereby minimizing or preventing a fade-out phenomenon at the time of a panel driving and being capable of implementing an OLED with a high image quality.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for fabricating an OLED, comprising:
    providing a transparent substrate;
    forming a first electrode on the transparent substrate;
    forming a first silicon nitride film and a second silicon nitride film on the first electrode, wherein the second silicon nitride film is thicker than the first silicon nitride film;
    etching the first silicon nitride film and the second silicon nitride film by a dry etching process to form a partition wall including a first silicon nitride film pattern and a second silicon nitride film pattern on the first electrode, wherein the first silicon nitride film pattern has a forwardly-tapered shape, and the second silicon nitride film pattern has an inversely-tapered shape, and the first silicon nitride film pattern and the second silicon nitride film pattern have different composition ratios between their silicon and nitrogen contents from each other, and wherein the forwardly-tapered shape and the inversely-tapered shape are formed simultaneously by one etching process, and wherein the forwardly-tapered shape and the inversely-tapered shape are formed by the dry etching process being processed from an interface between the first silicon nitride film and the second silicon nitride film; and
    forming an organic light emitting layer and a second electrode, sequentially, on both sides of the first electrode below a level of the partition wall.

2. The method of the claim 1, wherein the first electrode is formed of ITO or a transparent material, and the second electrode is formed of Al.

3. A method for fabricating an organic light emitting display device (OLED), comprising:
    providing a transparent substrate;
    forming a first electrode on the transparent substrate;
    forming a partition wall on the first electrode, the partition wall having a double-layered structure with first and second silicon nitride films, the first and second silicon nitride films have different composition ratio s between their silicon and nitrogen contents from each other, and wherein the partition wall having a double film structure is composed of a first tapered structure having a forwardly-tapered shape and a second tapered shape having an inversely-tapered shape, and wherein the first tapered shape and the second tapered shape are formed simultaneously by one etching process, and wherein the forwardly-tapered shape and the inversely-tapered shape are formed by the etching process being processed from an interface between the first silicon nitride film and the second silicon nitride film; and
    stacking an organic light emitting layer and a second electrode on both sides of the first electrode below a level of the partition wall.

\* \* \* \* \*